(12) United States Patent
Onuma et al.

(10) Patent No.: US 11,909,335 B2
(45) Date of Patent: Feb. 20, 2024

(54) ELECTROSTATIC CHUCK AND SUBSTRATE FIXING DEVICE

(71) Applicant: SHINKO ELECTRIC INDUSTRIES CO., LTD., Nagano (JP)

(72) Inventors: Takashi Onuma, Nagano (JP); Keiichi Takemoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 111 days.

(21) Appl. No.: 17/550,502

(22) Filed: Dec. 14, 2021

(65) Prior Publication Data

US 2022/0190749 A1 Jun. 16, 2022

(30) Foreign Application Priority Data

Dec. 16, 2020 (JP) ................. 2020-208364

(51) Int. Cl.
*H02N 13/00* (2006.01)
*H01L 21/683* (2006.01)
*H01J 37/32* (2006.01)

(52) U.S. Cl.
CPC ......... *H02N 13/00* (2013.01); *H01L 21/6831* (2013.01); *H01L 21/6833* (2013.01); *H01J 37/32715* (2013.01); *H01J 2237/2007* (2013.01); *H01J 2237/334* (2013.01)

(58) Field of Classification Search
CPC ............... H01L 21/683; H01L 21/6833; H01L 21/67103; H01L 21/67109; H01L 21/68757; H02N 13/00; H01J 37/32715; H01J 2237/2007

USPC ........................................ 361/234
See application file for complete search history.

(56) References Cited

U.S. PATENT DOCUMENTS

| 6,108,189 A * | 8/2000 | Weldon ............... | C23C 16/4586 279/128 |
| 6,522,519 B1 * | 2/2003 | Hirayanagi ......... | H01L 21/6833 361/233 |
| 2003/0106647 A1 * | 6/2003 | Koshiishi ............ | C23C 16/4585 156/345.43 |
| 2018/0108555 A1 | 4/2018 | Kosakai et al. | |

FOREIGN PATENT DOCUMENTS

WO 2016/158110 10/2016

* cited by examiner

*Primary Examiner* — Danny Nguyen
(74) *Attorney, Agent, or Firm* — Rankin, Hill & Clark LLP

(57) ABSTRACT

An electrostatic chuck includes a base body having a placement surface on which a suction target object is placed, and an electrode embedded in the base body. The base body is provided with a groove that opens to the placement surface-side and does not reach the electrode. A loes-resistance region made of ceramics and a high-resistance region made of ceramics having a volume resistivity higher than the low-resistance region are sequentially arranged from a side close to the groove between a bottom surface of the groove and the electrode, in a thickness direction of the base body.

9 Claims, 5 Drawing Sheets

ELECTROSTATIC CHUCK AND SUBSTRATE FIXING DEVICE

CROSS-REFERENCE TO RELATED APPLICATIONS

This application is based on and claims the benefit of priority from prior Japanese patent application No. 2020-208364 filed on Dec. 16, 2020, the entire contents of which are incorporated herein by reference.

TECHNICAL FIELD

The present disclosure relates to an electrostatic chuck and a substrate fixing device.

BACKGROUND ART

In the related art, a film formation apparatus (for example, a CVD apparatus, a PVD apparatus, and the like) and a plasma etching apparatus that are used when manufacturing a semiconductor device such as an IC and an LSI have a stage for accurately holding a wafer in a vacuum treatment chamber.

As such stage, for example, suggested is a substrate fixing device configured to suck and hold a wafer, which is a suction target object, by an electrostatic chuck mounted on a base plate. For example, an electrostatic electrode is embedded in a base body of the electrostatic chuck, and a placement surface of the base body for sucking and holding a wafer is formed with an unevenness structure.

CITATION LIST

Patent Literature

PTL 1: WO2016/158110

SUMMARY OF INVENTION

However, when the placement surface for sucking and holding a wafer has an unevenness structure, a distance between a bottom surface of a concave portion and the electrostatic electrode embedded in the base body is short, so that an electric discharge may easily occur.

The present disclosure has been made in view of the above situations, and an object thereof is to suppress occurrence of an electric discharge in an electrostatic chuck.

An embodiment of the present disclosure relates to an electrostatic chuck. The electrostatic chuck comprises a base body having a placement surface on which a suction target object is placed, and an electrode embedded in the base body. The base body is provided with a groove that opens to the placement surface-side and does not reach the electrode. A low-resistance region made of ceramics and a high-resistance region made of ceramics having a volume resistivity higher than the low-resistance region are sequentially arranged from a side close to the groove between a bottom surface of the groove and the electrode, in a thickness direction of the base body.

According to the disclosed technology, it is possible to suppress occurrence of an electric discharge in the electrostatic chuck.

DESCRIPTION OF EMBODIMENTS

Hereinafter, embodiments of the present disclosure will be described with reference to the drawings. Note that, in the respective drawings, the parts having the same configurations are denoted with the same reference signs, and the overlapping descriptions may be omitted.

First Embodiment

[Structure of Substrate Fixing Device]

Figure 1A:
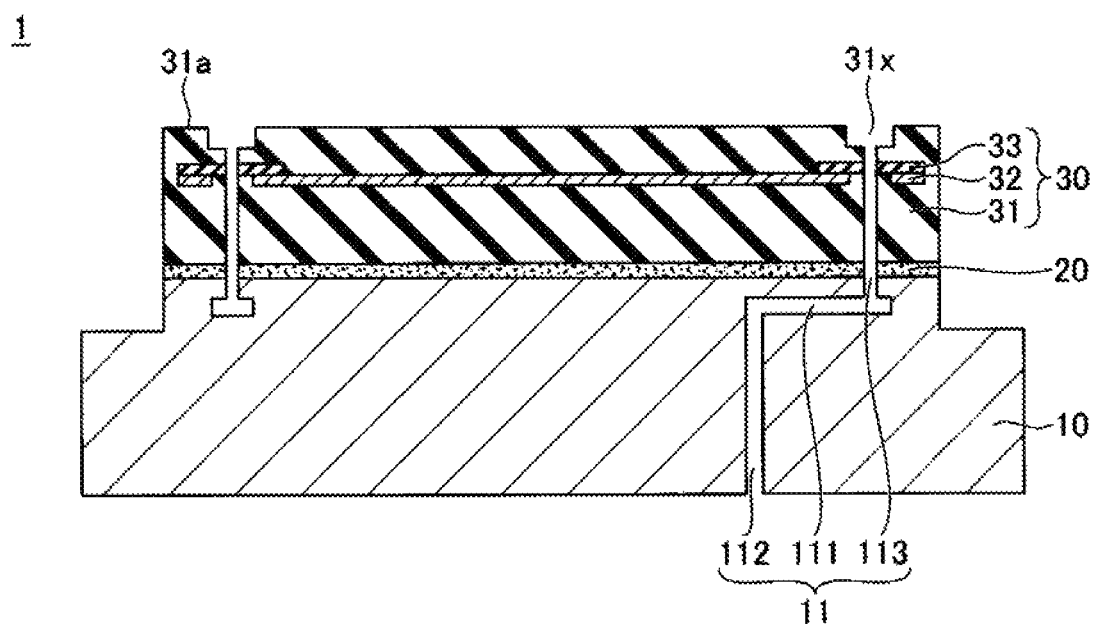
FIGS. 1A and 1B are views simplifying and exemplifying a substrate fixing device according to a first embodiment.
Figure 1B:
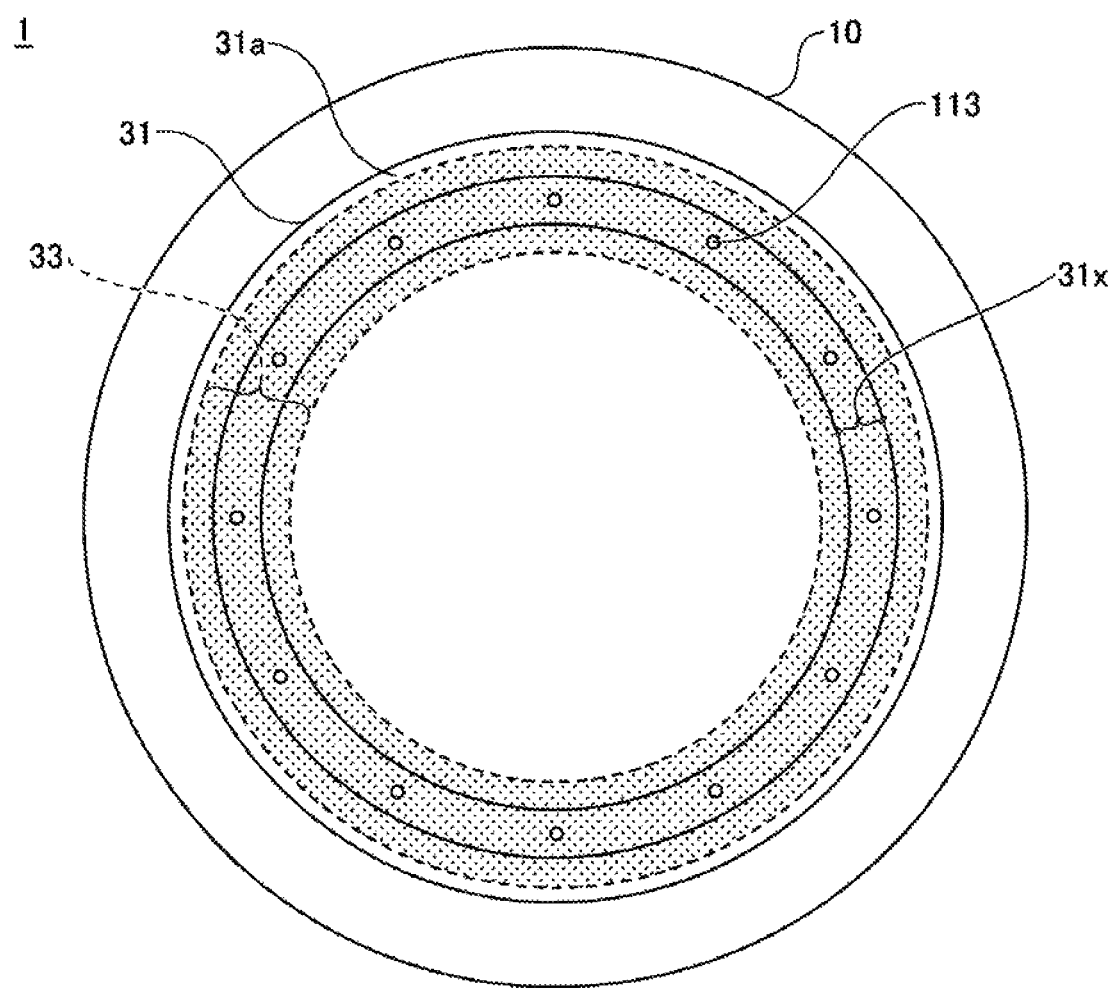

FIGS. 1A and 1B are views simplifying and exemplifying a substrate fixing device according to a first embodiment, in which FIG. 1A is a sectional view and FIG. 1B is a plan view. Referring to FIGS. 1A and 1B, a substrate fixing device 1 has, as main constitutional elements, a base plate 10, an adhesive layer 20, and an electrostatic chuck 30. The substrate fixing device 1 is a device configured to suck and hold a substrate (for example, a semiconductor wafer, and the like), which is a suction target object, by the electrostatic chuck 30.

The base plate 10 is a member for mounting the electrostatic chuck 30. A thickness of the base plate 10 is, for example, about 20 to 40 mm. The base plate 10 is formed of, for example, a metal material such as aluminum and cemented carbide, a composite material of the metal material and ceramics, or the like, and can be used as an electrode or the like for controlling plasma. For example, from standpoints of easy availability, easy processing, favorable thermal conductivity and the like, aluminum or an alloy thereof is used, and the material whose surface has been subjected to an alumite treatment (insulation layer formation) can be favorably used.

For example, by supplying predetermined high-frequency electric power to the base plate 10, the energy for causing ions and the like in a generated plasma state to collide with a substrate sucked on the electrostatic chuck 30 can be controlled and etching processing can be effectively performed.

The base plate 10 may be provided therein with a coolant flow path. The coolant flow path is, for example, a hole formed in an annular shape in the base plate 10. For example, coolant such as cooling water and GALDEN is introduced into the coolant flow path from an outside of the substrate fixing device 1. By circulating the coolant in the coolant flow path to cool the base plate 10, it is possible to cool the substrate sucked on the electrostatic chuck 30.

The electrostatic chuck 30 is mounted on one surface of the base plate 10 via the adhesive layer 20. The adhesive layer 20 is, for example, a silicone adhesive. A thickness of the adhesive layer 20 is, for example, about 0.01 to 1.0 mm. The adhesive layer 20 has effects of bonding the base plate 10 and the electrostatic chuck 30 and reducing stress that is generated due to a difference in thermal expansion coefficient between the electrostatic chuck 30 made of ceramics and the base plate 10 made of aluminum. Note that, the electrostatic chuck 30 may also be fixed to the base plate 10 by screws.

The electrostatic chuck 30 has, as main constitutional elements, a base body 31, an electrostatic electrode 32, and a high-resistance region 33. An upper surface of the base body 31 is a placement surface 31a on which a suction target object is placed. A planar shape of the electrostatic chuck 30 is formed according to a shape of the substrate, and is circular, for example. A diameter of the wafer that is a suction target object of the electrostatic chuck 30, is, for example, 8 inches, 12 inches or 18 inches. The electrostatic chuck 30 is a Johnsen-Rahbeck type electrostatic chuck.

Note that, the description 'as seen from above' indicates that a target object is seen from a normal direction of the placement surface 31a of the base body 31, and the description 'planar shape' indicates a shape of the target object as seen from the normal direction of the placement surface 31a of the base body 31.

The base body 31 is a dielectric body. As the base body 31, for example, ceramics such as aluminum oxide ($Al_2O_3$) and aluminum nitride (AlN) are used. In the base body 31, for example, titanium oxide is added. The base body 31 may include, as auxiliary agents, oxides of two or more elements selected from silicon (Si), magnesium (Mg), calcium (Ca), aluminum (Al) and yttrium (Y). A thickness of the base body 31 is, for example, about 0.5 to 10 mm, and a relative permittivity (kHz) of the base body 31 is, for example, about 9 to 10.

The electrostatic electrode 32 is a thin film electrode, and is embedded in the base body 31. The electrostatic electrode 32 is connected to a power supply provided outside the substrate fixing device 1, and generates a suction force between the electrostatic electrode and the substrate by static electricity when a predetermined voltage is applied from the power supply, Thereby, it is possible to suck and hold the substrate on the placement surface 31a of the base body 31 of the electrostatic chuck 30. The higher the voltage applied to the electrostatic electrode 32 is, the stronger the suction holding force is. The electrostatic electrode 32 may have a unipolar shape or a bipolar shape. As a material of the electrostatic electrode 32, tungsten, molybdenum or the like is used, for example.

The base body 31 may be provided therein with a heat generating body configured to generate heat by applying a voltage from an outside of the substrate fixing device 1 and to heat so that the placement surface 31a of the base body 31 becomes a predetermined temperature.

In the electrostatic chuck 30 and the base plate 10, a gas supply unit 11 configured to supply a gas for cooling a substrate that is sucked and held on the electrostatic chuck 30 is provided. The gas supply unit 11 includes a gas flow path 111, a gas injection portion 112, and gas discharge portions 113.

The gas flow path 111 is, for example, a hole formed in an annular shape in the base plate 10. The gas injection portion 112 is a hole having one end configured to communicate with the gas flow path 111, passing through an inside of the base plate 10 and having the other end exposed to an outside from a lower surface of the base plate 10, and is configured to introduce an inert gas (for example, He, Ar and the like) into the gas flow path 111 from an outside of the substrate fixing device 1.

The base body 31 is provided with a groove 31x that opens to the placement surface 31a-side and does not reach the electrostatic electrode 32. The groove 31x is provided in an annular shape to the base body 31, as seen from above, for example. A sectional shape of the groove 31x in a width direction is rectangular, for example. A width of the groove 31x is, for example, about 0.5 mm to 2 mm. A depth of the groove 31x based on the placement surface 31a of the base body 31 is, for example, about 0.1 mm to 0.5 mm.

The gas discharge portion 113 has one end configured to communicate with the gas flow path 111 and the other end exposed to an outside from a bottom surface of the groove 31x provided in the placement surface 31a of the base body 31, and is configured to discharge the inert gas introduced into the gas flow path 111 to a lower surface-side of the substrate. In other words, the gas discharge portion 113 opens to the bottom surface of the groove 31x, penetrates the high-resistance region 33 in the thickness direction of the base body 31 from the bottom surface of the groove 31x, and further penetrates the adhesive layer 20 to communicate with the gas flow path 111 formed in the base plate 10.

The gas discharge portions 113 dot in the bottom surface of the groove 31x, as seen from above. Specifically, the gas discharge portions 113 are provided at predetermined intervals in an annular shape in the bottom surface of the groove 31x, as seen from above. The number of the gas discharge portions 113 can be determined as appropriate, as required, but is about 10 to 100, for example. By supplying the gas into the groove 31x, it is possible to easily remove the substrate sucked on the placement surface 31a.

In the meantime, since a distance between the bottom surface of the groove 31x and an upper surface of the electrostatic electrode 32 is shorter than a distance between the placement surface 31a and the upper surface of the electrostatic electrode 32, an electric discharge is likely to occur in the vicinity of the groove 31x. In particular, in a case where titanium oxide or the like is added to the base body 31 so as to obtain a low-resistance characteristic, particles of ceramics constituting the base body 31 become large, resulting in a decrease in density and weakening of ceramics. For this reason, voids and the like are likely to be generated in the base body 31, which is a cause of the electric discharge. When the distance to the upper surface of the electrostatic electrode 32 is short, such as the vicinity of the groove 31x, the electric discharge is likely to occur even in small voids.

In the electrostatic chuck 30, the high-resistance region 33 is provided between the bottom surface of the groove 31x and the upper surface of the electrostatic electrode 32 (the surface on the groove 31x-side) in the thickness direction of the base body 31. The high-resistance region 33 is arranged in contact with the upper surface of the electrostatic electrode for example. The high-resistance region 33 is a region in which a volume resistivity is higher than other regions of the base body 31. Note that, in FIGS. and 113 and the like, for convenience, the high-resistance region 33 is denoted with a reference sign separate from the base body 31. However, the high-resistance region 33 is a part of ceramics constituting the base body 31.

Specifically, in the base body 31, a low-resistance region made of ceramics and the high-resistance region 33 made of ceramics having a volume resistivity higher than the low-resistance region are sequentially arranged from a side close to the groove 31x between the groove 31x and the electrostatic electrode 32, in the thickness direction of the base body 31. In the base body 31, the entire region except the high-resistance region 33 is the low-resistance region.

The volume resistivity of the high-resistance region 33 is, for example, $10^{15}$ Ωm or higher. In the base body 31, the volume resistivity of the region (i.e., the low-resistance region) except the high-resistance region 33 is, for example, about $10^{10}$ to $10^{12}$ Ωm. For example, the volume resistivity of the high-resistance region 33 is 100 times or more the volume resistivity of the low-resistance region. The high-resistance region 33 is provided between the groove 31x and the electrostatic electrode 32, so that it is possible to suppress occurrence of the electric discharge in the vicinity of the groove 31x.

For the high-resistance region 33, any material can be used as long as it has a volume resistivity higher than the low-resistance region constituting a main part of the base body 31. However, for example, the high-resistance region 33 is preferably formed of aluminum oxide (alumina) that is dense and has a high resistance and high withstand voltage characteristic. For example, it is possible to form a region having a volume resistivity higher than a low-resistance region by using aluminum oxide in which titanium oxide and the like are not added. Note that, the material for forming the high-resistance region 33 is not limited to the aluminum oxide single body, and oxides of Si, Ca, Mg and the like may be added. It is preferable that the main components (for example, alumina) of the high resistance region and the low resistance region are the same. In this case, the volume resistivity can be changed by changing the type of additive.

From a standpoint of increasing an effect of suppressing the electric discharge, the high-resistance region 33 is preferably provided in a region overlapping the groove 31x, as seen from above. For example, in a case where the groove 31x is provided in an annular shape, as seen from above, the high-resistance region 33 is preferably provided in an annular shape in a region overlapping the groove 31x. In addition, a width of the high-resistance region 33 may be the same as the groove 31x. However, from the standpoint of increasing the effect of suppressing the electric discharge, the width of the high-resistance region 33 is preferably greater than the groove 31x. A thickness of the high-resistance region 33 is preferably equal to or greater than 10 μm and equal to or smaller than 30 μm. When the thickness of the high-resistance region 33 is equal to or greater than 10 μm, the effect of suppressing the electric discharge is sufficiently obtained. In addition, when the thickness of the high-resistance region 33 is equal to or smaller than 30 μm, the favorable adhesion between the low-resistance region located around the high-resistance region 33 and the electrostatic electrode 32 is obtained.

[Manufacturing Method of Substrate Fixing Device]

FIGS. 2A to 2D exemplify a manufacturing process of the substrate fixing device according to the first embodiment, showing a section corresponding to FIG. 1A. Here, a process of manufacturing the electrostatic chuck 30 is mainly described with reference to FIG. 2A to 2D.

Figure 2A:
FIGS. 2A to 2D are views exemplifying a manufacturing process of the substrate fixing device according to the first embodiment.

First, in a process shown in FIG. 2A, a green sheet 311 is prepared, and a paste 331 is printed on the green sheet 311. The paste 331 is a material that is to be the high-resistance region 33 by firing. The paste 331 is, for example, aluminum oxide (alumina paste) in a paste state that is dense and has a high resistance and high withstand voltage characteristic and titanium oxide and the like are not added therein. The paste 331 may be provided to overlap a region, in which the groove 31x is to be formed in a subsequent process, as seen from above, for example. The printing may be repeated multiple times so that the paste 331 has a required thickness.

Figure 2B:
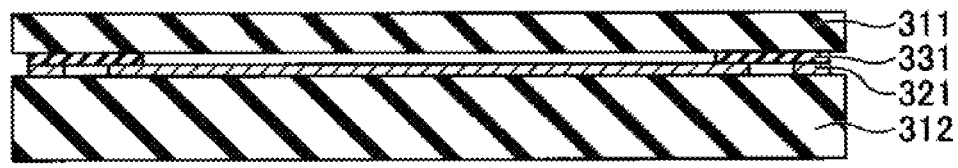

Then, in a process shown in FIG. 2B, a metal paste 321 is printed on the green sheet 311 in a predetermined pattern so as to cover the paste 331. The metal paste 321 is a material that is to be the electrostatic electrode 32 by firing. The metal paste 321 is, for example, a tungsten paste or a molybdenum paste. After printing the metal paste 321, the green sheet 311 having the paste 331 and the metal paste 321 formed thereon is stacked on a green sheet 312 in a state where the metal paste 321 is made to face toward the green sheet 312.

Figure 2C:
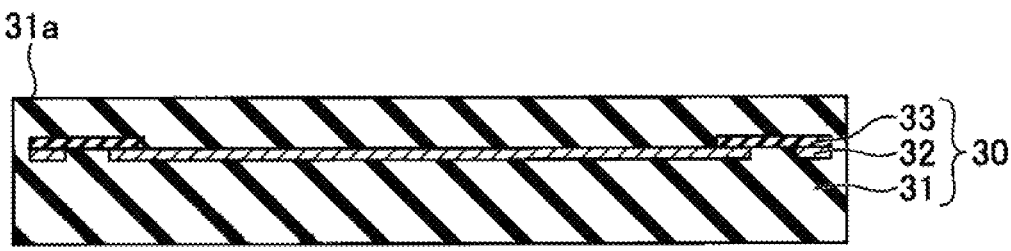

Then, in a process shown in FIG. 2C, a structure shown in FIG. 2B is fired, and a surface polishing and the like are performed, as required. By the firing, the green sheet 311 and the green sheet are integrated, so that the base body 31 is formed. In addition, by the firing, the electrostatic electrode 32 is formed from the metal paste 321, and the high-resistance region 33 is formed from the paste 331.

Figure 2D:
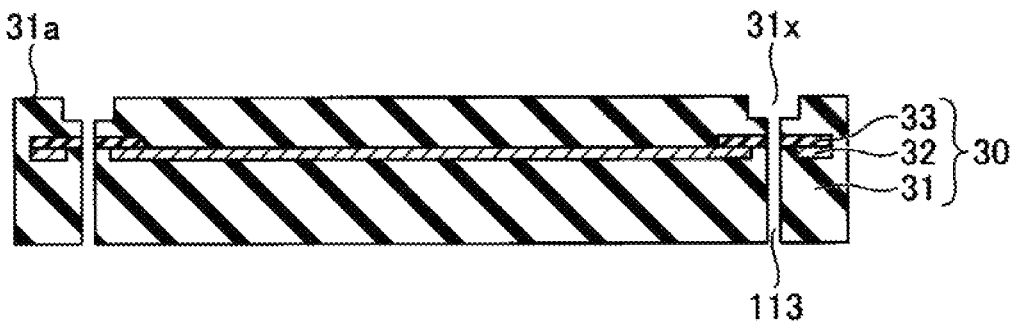

Then, in a process shown in FIG. 2D, the groove 31x and the gas discharge portions 113 opening to the bottom surface of the groove 31x are formed. The gas discharge portions 113 are formed to penetrate the high-resistance region 33 in the thickness direction of the base body 31 from the bottom surface of the groove 31x and to be exposed from the lower surface-side of the base body 31. The groove 31x and the gas discharge portions 113 can be formed by blast processing, drill processing or the like, for example.

After the process shown in FIG. 2D, the base plate 10 in which the gas flow path 111, the gas injection portion 112, the cooling mechanism and the like are formed in advance is prepared, and the adhesive layer 20 (not cured) is formed on the base plate 10. Then, a structure shown in FIG. 2D is mounted on one surface of the base plate 10 with the adhesive layer 20 being interposed therebetween, and the adhesive layer 20 is cured. By the above processes, the substrate fixing device 1 shown in FIG. 1A is completed.

In this way, the high-resistance region 33 is provided between the groove 31x and the electrostatic electrode 32 in the thickness direction of the base body 31, so that even when there is a fragile place leading to the electrostatic electrode 32, a path of the electric discharge from the placement surface 31a-side toward the electrostatic electrode 32 is shut off by the high-resistance region 33. As a result, it is possible to suppress occurrence of the electric discharge in the vicinity of the groove 31x.

The high-resistance region 33 is particularly effective when applied to a Johnsen-Rahbeck type electrostatic chuck in which a volume resistivity of a main part of the base body 31 is relatively low and the electric discharge is likely to occur. However, the high-resistance region 33 may also be applied to a Coulomb force type electrostatic chuck.

Note that, the high-resistance region 33 exhibits the effect of suppressing the electric discharge even when the groove 31x is not provided in an annular shape or the gas discharge portions 113 are not opened to the groove 31x.

First Modified Embodiment of First Embodiment

In a first modified embodiment of the first embodiment, an example of a substrate fixing device including an electrostatic chuck having a plurality of grooves is shown. Note that, in the first modified embodiment of the first embodiment, the descriptions of the same constitutional parts as the embodiment already described may be omitted.

Figure 3A:
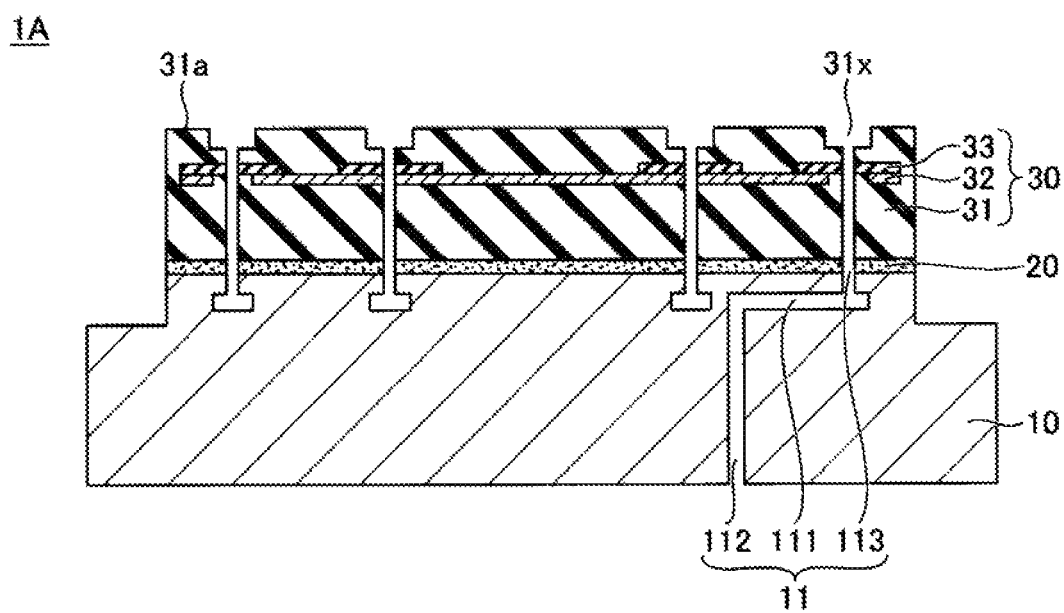
FIGS. 3A and 3B are views simplifying and exemplifying a substrate fixing device according to a first modified embodiment of the first embodiment.
Figure 3B:
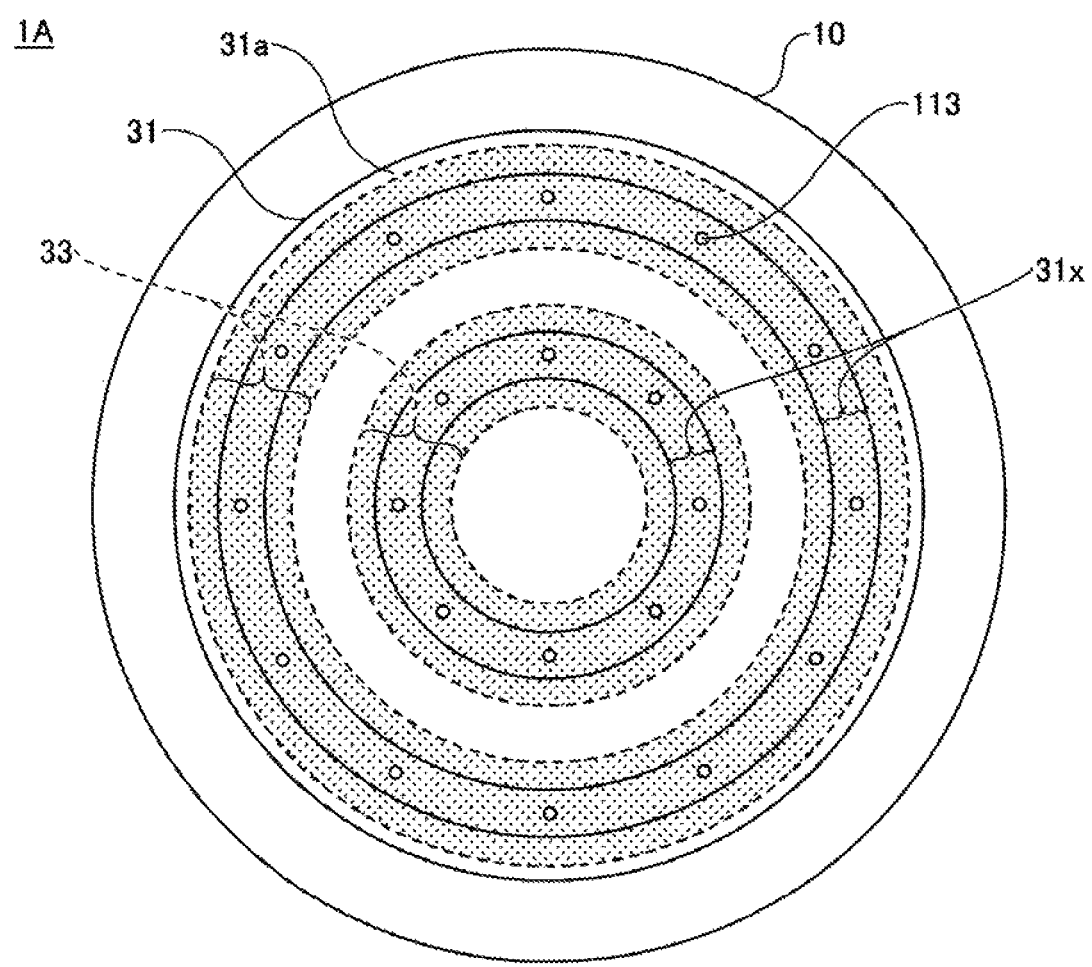

FIGS. 3A and 3B are views simplifying and exemplifying a substrate fixing device according to a first modified embodiment of the first embodiment, in which FIG. 3A is a sectional view and FIG. 3B is a plan view. Referring to FIGS. 3A and 3B, a substrate fixing device 1A is provided with two grooves 31x in a concentric manner so as not to be in contact with each other, as seen from above. The gas discharge portions 113 are opened to the bottom surface of each of the grooves 31x. In the thickness direction of the base body 31, the high-resistance region 33 is provided between each of the grooves 31x and the electrostatic electrode 32. The high-resistance region 33 is provided in an annular shape in a region overlapping each of the grooves 31x, as seen from above, for example.

In this way, the base body 31 of the electrostatic chuck 30 may be provided with the two grooves 31x opening to the placement surface 31a. Also in this case, the high-resistance region 33 is provided between each of the grooves 31x and the electrostatic electrode 32, so that it is possible to suppress occurrence of the electric discharge in the vicinity of each of the grooves 31x.

In addition, the gas discharge portions 113 are opened to the bottom surface of each of the grooves 31x opening to the placement surface 31a, so that it is possible to effectively cool the substrate, which is a suction target object. Further, by supplying the gas into each of the grooves 31x, it is possible to further easily remove the substrate sucked on the placement surface 31a. Note that, the three or more grooves 31x opening to the placement surface 31a may also be provided.

Although the preferred embodiments and the like have been described in detail, the present invention is not limited to the above-described embodiments and the like, and a variety of changes and replacements can be made for the above-described embodiments and the like without departing from the scope defined in the claims.

For example, as the suction target object of the substrate fixing device of the present invention, a glass substrate and the like that are used in a manufacturing process of a liquid crystal panel and the like may be exemplified, in addition to the semiconductor wafer (silicon wafer, and the like).

What is claimed is:

1. An electrostatic chuck comprising:
    a base body having a placement surface on which a suction target object is placed;
    an electrode embedded in the base body; and
    a gas discharge portion,
    wherein the base body is provided with a groove that opens to the placement surface-side and does not reach the electrode,
    wherein a low-resistance region made of ceramics and a high-resistance region made of ceramics having a volume resistivity higher than the low-resistance region are sequentially arranged from a side close to the groove between a bottom surface of the groove and the electrode, in a thickness direction of the base body, and
    wherein the gas discharge portion opens to the bottom surface of the groove, and the gas discharge portion is formed to penetrate the high-resistance region.

2. The electrostatic chuck according to claim 1, wherein the high-resistance region is provided in a region overlapping the groove, as seen from above.

3. The electrostatic chuck according to claim 2, wherein the groove is provided in an annular shape, as seen from above, and
    wherein the high-resistance region is provided in an annular shape in the region overlapping the groove.

4. The electrostatic chuck according to claim 3, wherein a plurality of grooves is provided in a concentric manner so as not to be in contact with each other, as seen from above,
    a plurality of gas discharge portions are provided to open to the bottom surface of each of the plurality of grooves, and
    wherein the high-resistance region is provided in an annular shape in a region overlapping each of the grooves, as seen from above.

5. The electrostatic chuck according to claim 1, wherein the high-resistance region has a width greater than the groove.

6. The electrostatic chuck according to claim 1, wherein the high-resistance region is in contact with a surface of the electrode facing toward the groove.

7. The electrostatic chuck according to claim 1, wherein the high-resistance region is formed of aluminum oxide and has a volume resistivity of $10^{15}$ $\Omega$m or higher.

8. The electrostatic chuck according to claim 1, wherein the electrostatic chuck is a Johnsen-Rahbeck type.

9. A substrate fixing device comprising:
    a base plate; and
    the electrostatic chuck according to claim 1 mounted on a surface of the base plate.

* * * * *